United States Patent
Hirabayashi

(10) Patent No.: US 6,469,557 B2
(45) Date of Patent: Oct. 22, 2002

(54) SEMICONDUCTOR INTEGRATED CIRCUIT AND DELAYED CLOCK SIGNAL GENERATION METHOD

(75) Inventor: Osamu Hirabayashi, Hiratsuka (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/865,462

(22) Filed: May 29, 2001

(65) Prior Publication Data

US 2001/0048331 A1 Dec. 6, 2001

(30) Foreign Application Priority Data

May 30, 2000 (JP) ......................... 2000-160486

(51) Int. Cl.[7] ............................................. H03H 11/26
(52) U.S. Cl. .................. 327/263; 327/264; 327/276; 327/277; 327/278; 327/393; 327/394
(58) Field of Search ................................. 327/113, 170, 327/263, 264, 276, 277, 281, 284, 285, 393, 396, 278, 394, 395, 400, 401, 154, 158

(56) References Cited

U.S. PATENT DOCUMENTS

| | | | | |
|---|---|---|---|---|
| 4,922,141 A | * | 5/1990 | Lofgren et al. | 327/158 |
| 5,087,829 A | * | 2/1992 | Ishibashi et al. | 327/158 |
| 5,208,557 A | * | 5/1993 | Kersh, III | 331/57 |
| 5,231,320 A | | 7/1993 | Kase | |
| 5,548,235 A | * | 8/1996 | Marbot | 327/158 |
| 5,920,222 A | | 7/1999 | Eustis et al. | |
| 5,959,927 A | * | 9/1999 | Yamagata et al. | 365/229 |
| 5,973,525 A | * | 10/1999 | Fujii | 327/158 |

FOREIGN PATENT DOCUMENTS

| | | |
|---|---|---|
| JP | 5-218829 | 8/1993 |
| JP | 07-262076 | 10/1995 |
| JP | 08-152935 | 6/1996 |
| JP | 10-150350 | 6/1998 |

* cited by examiner

Primary Examiner—Timothy P. Callahan
Assistant Examiner—An T. Luu
(74) Attorney, Agent, or Firm—Banner & Witcoff, Ltd.

(57) ABSTRACT

An object of the present invention is to simply and rapidly adjust a delay time of a delayed clock signal in accordance with a change in frequency of an input clock signal.

The present invention comprises: a pulse generating circuit for generating a pulse signal PULSE with a trailing edge of an input clock signal as a reference; an inverter chain consisting of a plurality of inverters; a pair of inverter chains for sequentially delaying output signals from the pulse generating circuit; a plurality of NOR gates for adjusting a delay time of each inverter in the inverter chain; and a plurality of NAND gates for similarly adjusting a delay time of each inverter in the inverter chain. Since the delay time of the delayed clock signal in a next cycle is set based on the pulse signal generated based on a trailing edge of the input clock signal, even if a cycle of the input clock signal varies, the delay time of the delayed clock signal can be rapidly changed in accordance with this variation.

20 Claims, 6 Drawing Sheets

US 6,469,557 B2

SEMICONDUCTOR INTEGRATED CIRCUIT AND DELAYED CLOCK SIGNAL GENERATION METHOD

CROSS REFERENCE TO RELATED APPLICATIONS

This application claims benefit of priority under 35USC §119 to Japanese Patent Application No. 2000-160486, filed on May 30, 2000, the entire contents of which are incorporated by reference herein.

BACKGROUND OF THE INVENTION

1. Field of the Invention

The present invention relates to a semiconductor integrated circuit for generating a delayed clock signal synchronized with an input clock signal and relates to a circuit for use in the timing control of a sense amplifier of, e.g., an SRAM (Static Random Access Memory).

2. Related Background Art

Since a semiconductor storage device, especially an SRAM, can read/write data at a high speed, it is extensively used for a cache memory and the like. Although data read from a memory cell is supplied to a pair of bit lines, a difference in potential of a pair of bit lines is very small, and the data must be amplified by using a sense amplifier.

Since a latch type sense amplifier which is a one-circuit type of the sense amplifier can read data at a high speed, it is adopted to a high speed memory and the like.

FIG. 1 is a circuit diagram showing the structure of the periphery of a latch type sense amplifier of a conventional SRAM. As shown in the drawing, the sense amplifier includes: PMOS transistors Q11 and Q12 and NMOS transistors Q13 and Q14 constituting a flip flop; PMOS transistors Q15 and Q16 for switching whether or not to apply voltages of bit lines BL and BLB to the flip flop; an NMOS transistor Q17 for switching whether or not to perform the sense operation by the sense amplifier; and a timing generating circuit 11 for controlling on/off of the NMOS transistor Q17.

The timing generation circuit 11 is constituted by a plurality of cascade-connected inverters as a most simplified structure as shown in the drawing. The sense amplifier can be operated with an optimum timing by adjusting the number of stages of the inverters.

Since the latch type sense amplifier performs the sense operation in synchronization with an input clock signal, the timing must be designed so that the latch type sense amplifier can normally operate even if a frequency of the input clock signal is changed.

In case of the circuit shown in FIG. 1, however, the time from rising of the input signal to activation of the sense amplifier does not change even if the circuit is operated at a frequency lower than a target operating frequency, and hence there is a problem that a sense margin does not increase.

The sense margin becomes critical when the sense amplifier performs the operation at a high speed. For example, in the circuit illustrated in FIG. 1, if the operation timing of the sense amplifier is decided by using the timing at the time of the high speed operation as a reference, the operation timing of the sense amplifier quickens even at the time of the low speed operation. Thus, an erroneous operation may occur at the time of the low speed operation as well as the high speed operation.

On the other hand, although use of a synchronous circuit such as a PLL (Phase Locked Loop) circuit can be considered as a technique for obtaining a timing signal having a fixed phase with respect to a frequency of the input clock signal, the circuit scale becomes large, and the design is also complicated, which may lead to increase in the cost. Therefore, a simpler technique is desirable.

SUMMARY OF THE INVENTION

In view of the above-described problems, it is an object of the present invention to provide a semiconductor integrated circuit and a delayed clock signal generation method capable of simply and rapidly adjusting a delay time of a delayed clock signal in accordance with a change in frequency of an input clock signal.

To achieve this aim, there is provided a semiconductor integrated circuit for generating based on an input clock signal a delayed clock signal synchronized with the input clock signal, comprising:

an edge pulse generating circuit configured to generate a control pulse signal at a first cycle of the input clock signal based only on a leading edge or a trailing edge of the input clock signal; and a delay time setting circuit configured to set a delay time of the delayed clock signal in a second cycle of the input clock signal after the first cycle based on the control pulse signal.

According to the present invention, since a delay time of the delayed clock signal in a second cycle corresponding to the control pulse signal is set based on the control pulse signal generated by using a leading edge or a trailing edge of the input clock signal as a reference, the delay time of the delayed clock signal can be simply and rapidly adjusted in accordance with a change in frequency of the input clock signal. Therefore, when the control for switching the sense operation of the sense amplifier is conducted by using the delayed clock signal, it is possible to perform the sense operation of the sense amplifier with a timing optimum for a frequency of the input clock signal.

Furthermore, a semiconductor integrated circuit configured to generate a delay clock signal synchronized with an input clock signal based on the input clock signal, comprising:

a control pulse generating circuit configured to generate a control pulse signal of the input clock signal based on a leading edge or a trailing edge of the input clock signal; and a delay time setting circuit configured to set a delay time of the delay clock signal based on the control pulse signal, the delay time setting circuit comprising:

first to nth delaying circuits connected in series, each of the first to nth delaying circuits propagating the input clock signal in order;

(n+1)st to 2nth delaying circuits connected in series, each of the (n+1)st to 2n circuits propagating the control pulse signal, and the (n+1)st to 2nth delaying circuits corresponding to the first to nth delaying circuits, respectively, wherein the delay time in each of the first to nth delaying circuits is set based on the control pulse signal and output of the corresponding one of the 2nth to (n+1)st delaying circuits.

DESCRIPTION OF THE PREFERRED EMBODIMENTS

A semiconductor integrated circuit and a delayed clock signal generation method according to the present invention will now be specifically described hereinafter with reference to the accompanying drawings.

Figure 1:
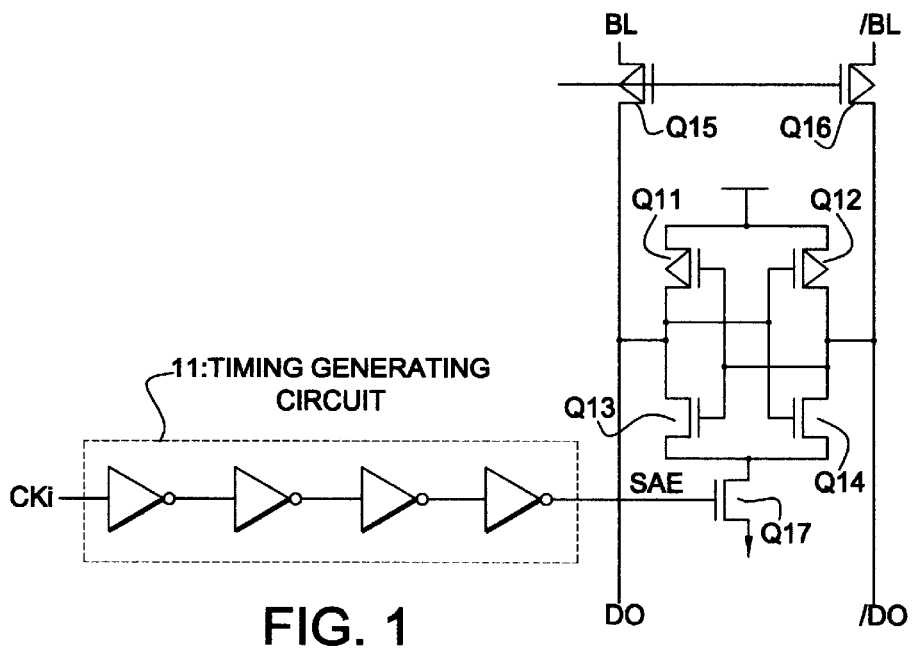
FIG. 1 is a circuit diagram showing the structure of a periphery of a latch type sense amplifier in a conventional SRAM.
Figure 2:
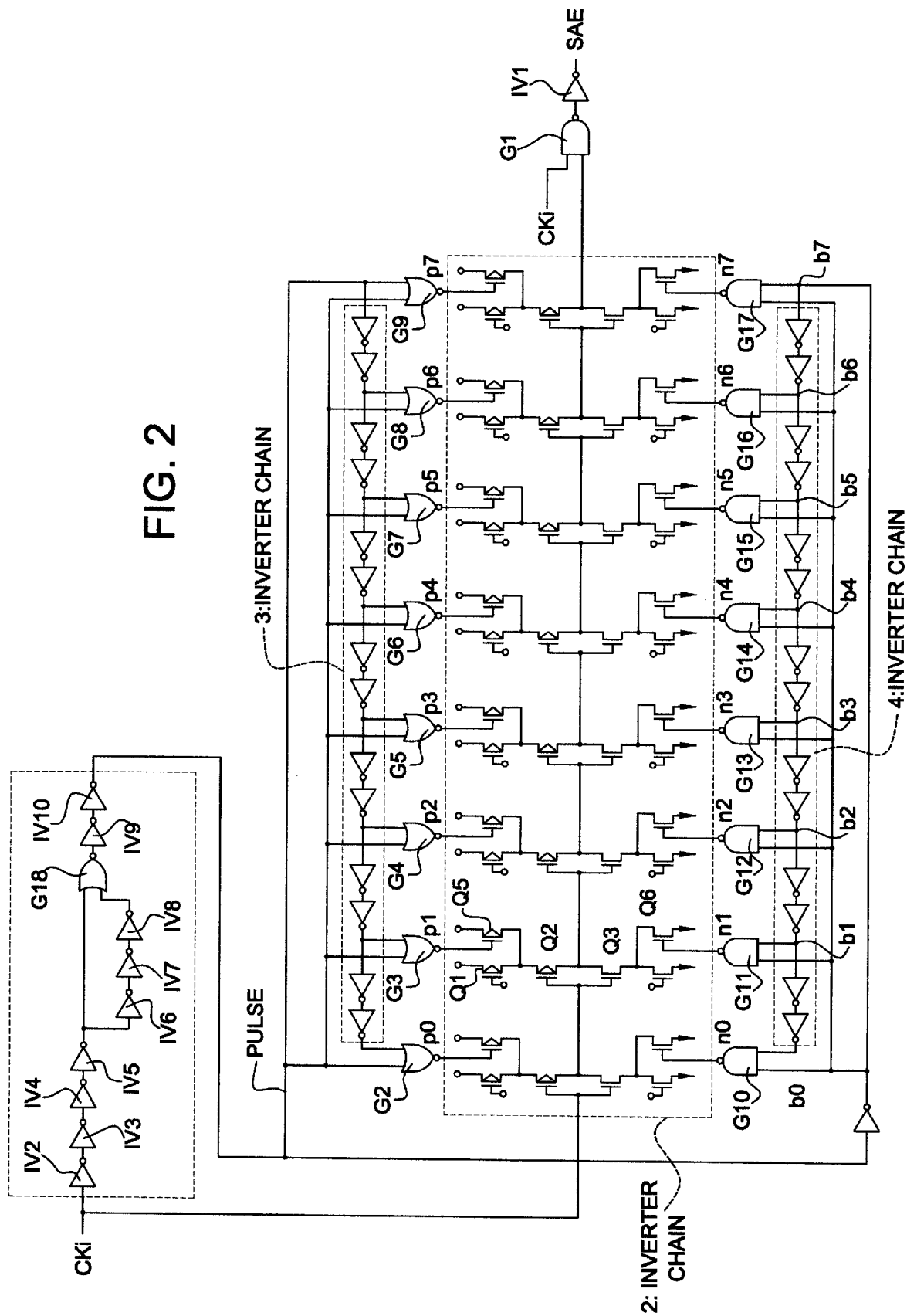
FIG. 2 is a circuit diagram showing an embodiment of a semiconductor integrated circuit according to the present invention.

FIG. 2 is a circuit diagram showing an embodiment of a semiconductor integrated circuit according to the present invention. The semiconductor integrated circuit shown in FIG. 2 generates a delayed clock signal SAE synchronized with an input clock signal CKi, and the generated delayed clock signal SAE is used for the timing control of the sense amplifier of, e.g., an SRAM. Specifically, the delayed clock signal SAE is inputted to a gate terminal of an NMOS transistor (sense operation controlling circuit) Q17 shown in FIG. 1.

A semiconductor integrated circuit illustrated in FIG. 2 includes: a pulse generating circuit (edge pulse generating circuit) 1 for generating a pulse signal PULSE by using a trailing edge of the input clock signal CKi as a reference; an inverter chain (first delaying circuit) 2 consisting of a plurality of inverters for sequentially delaying the input clock signal CKi while inverting the logic; an NAND gate G1 and an inverter IV1 for generating a delayed clock signal SAE based on an output from the inverter chain 2 and the input clock signal CKi; a pair of inverter chains 3 and 4 for sequentially delaying the output signal PULSE from the pulse generating circuit 1; a plurality of NOR gates G2 to G9 for adjusting a delay time of each inverter in the inverter chain 2; and a plurality of NAND gates G10 to G17 for similarly adjusting a delay time of each inverter in the inverter chain 2.

The inverter chains 2 to 4, the NOR gates G2 to G9, and the NAND gates G10 to G17 correspond to a delay time setting circuit. The inverter chains 3 and 4, the NOR gates G2 to G9, and the NAND gates G10 to G17 correspond to a delay controlling circuit. The inverter chains 3 and 4 correspond to a second delaying circuit. The NAND gate G1 and the inverter IV1 correspond to the delayed clock generating circuit.

Each inverter besides the inverter at last stage in the inverter chain 2 corresponds to first to nth delaying circuits, the inverter at last stage corresponds to the inverter at (2+1)st stage, and the inverter chains 3 and 4 correspond to the delaying circuits at (n+1)st to 2n stages.

Each inverter in the inverter chains 3 and 4 has PMOS transistors Q1 and Q2 (first and second PMOS transistors) and NMOS transistors Q3 and Q4 (first and second NMOS transistors) connected in series between a power supply terminal and a ground terminal. A PMOS transistor Q5 (third PMOS transistor) is connected to the PMOS transistor Q1 in parallel, and an NMOS transistor Q6 (third NMOS transistor) is connected to the NMOS transistor Q4 in parallel.

The PMOS transistor Q1 and the NMOS transistor Q4 are always in the ON state, and the gate terminal of the PMOS transistor Q5 is connected to an output terminal of a corresponding NOR gate. Further, the gate terminal of the NMOS transistor Q6 is connected to an output terminal of a corresponding NAND gate.

When the PMOS transistor Q5 and the NMOS transistor Q6 are turned on, a quantity of an electric current flowing to a corresponding inverter in the inverter chain 2 is increased, and the delay time of this inverter is shortened. On the other hand, when the PMOS transistor Q5 and the NMOS transistor Q6 are turned off, a quantity of an electric current flowing to a corresponding inverter in the inverter chain 2 is decreased, thereby prolonging the delay time of this inverter.

As described above, the delay time of each inverter in the inverter chain 2 can be adjusted by turning on/off the PMOS transistor Q5 and the NMOS transistor Q6 in accordance with respective outputs from the NOR gates G2 to G9 and the NAND gates G10 to G17.

The NOR gates G2 to G9 are connected to output terminals of inverters on even numbered stages in the inverter chain 3, and each NOR gate executes the NOR operation between an output signal of a corresponding inverter and an output signal PULSE of the pulse generating circuit 1. Outputs from the NOR gates G2 to G9 are supplied to the gate terminal of the corresponding PMOS transistor Q5 in the inverter chain 2.

The pulse generating circuit 1 has a plurality of inverters IV2 to IV10 and an NOR gate G18, and outputs a pulse signal PULSE having a predetermined pulse-width from a point in time which is behind a trailing edge of the input clock signal CKi by a predetermined time.

Figure 3:
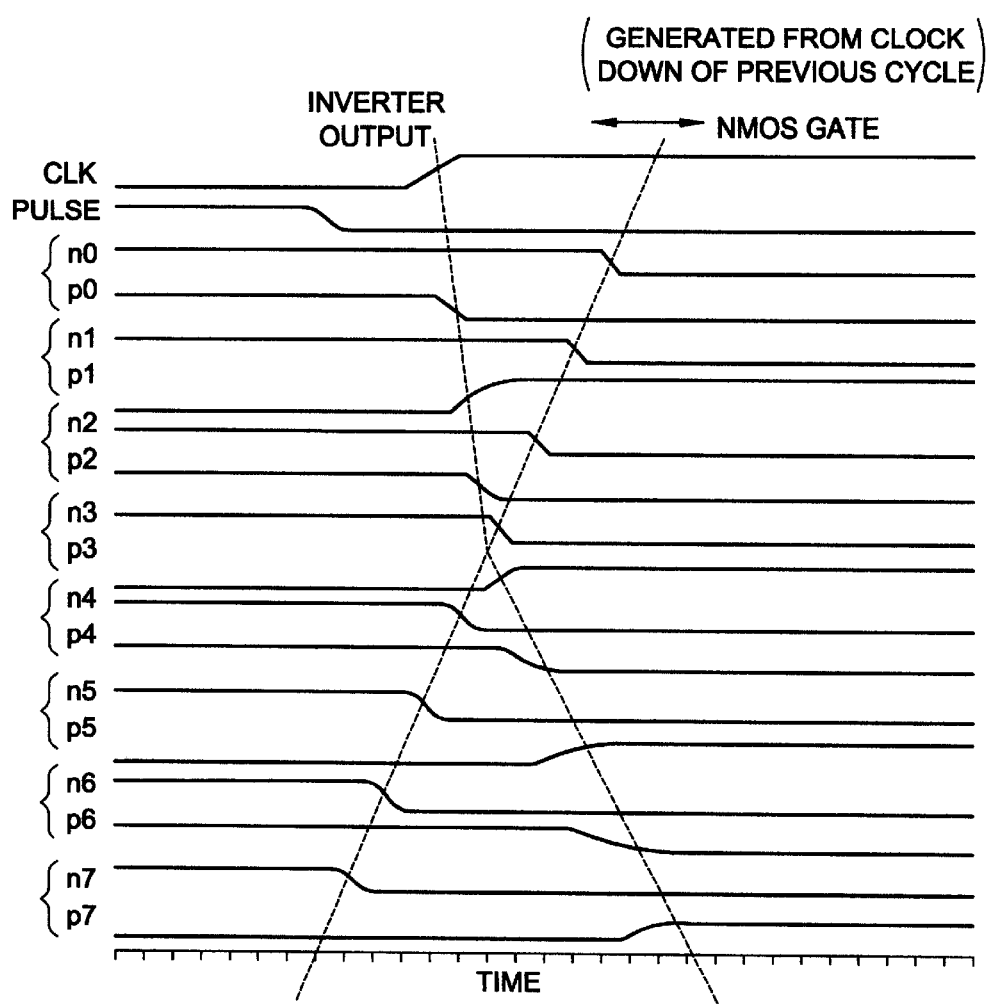
FIG. 3 is a timing waveform chart showing outputs d0 to d7 of respective inverters in an inverter chain 2 and outputs n0 to n7 of NAND gates G10 to G17.

FIG. 3 is a timing waveform chart showing outputs p0 to p7 of the respective inverters in the inverter chains 2 and outputs n0 to n7 of the NAND gates G10 to G17. As shown in the drawing, each inverter in the inverter chain 2 propagates the input clock signal Cki while gradually delaying it. Further, as to the timing with which outputs p0 to p7 from the NAND gates G10 to G17 change from the high level to the low level, the output p7 is the earliest and the output p0 is the latest. Therefore, the inverter on the last stage in the inverter chain 2 whose delay time is controlled by the output p7 has the longest delay time, and the inverter on the initial stage of the inverter chain 2 whose delay time is controlled by the output p0 has the shortest delay time.

Figure 4:
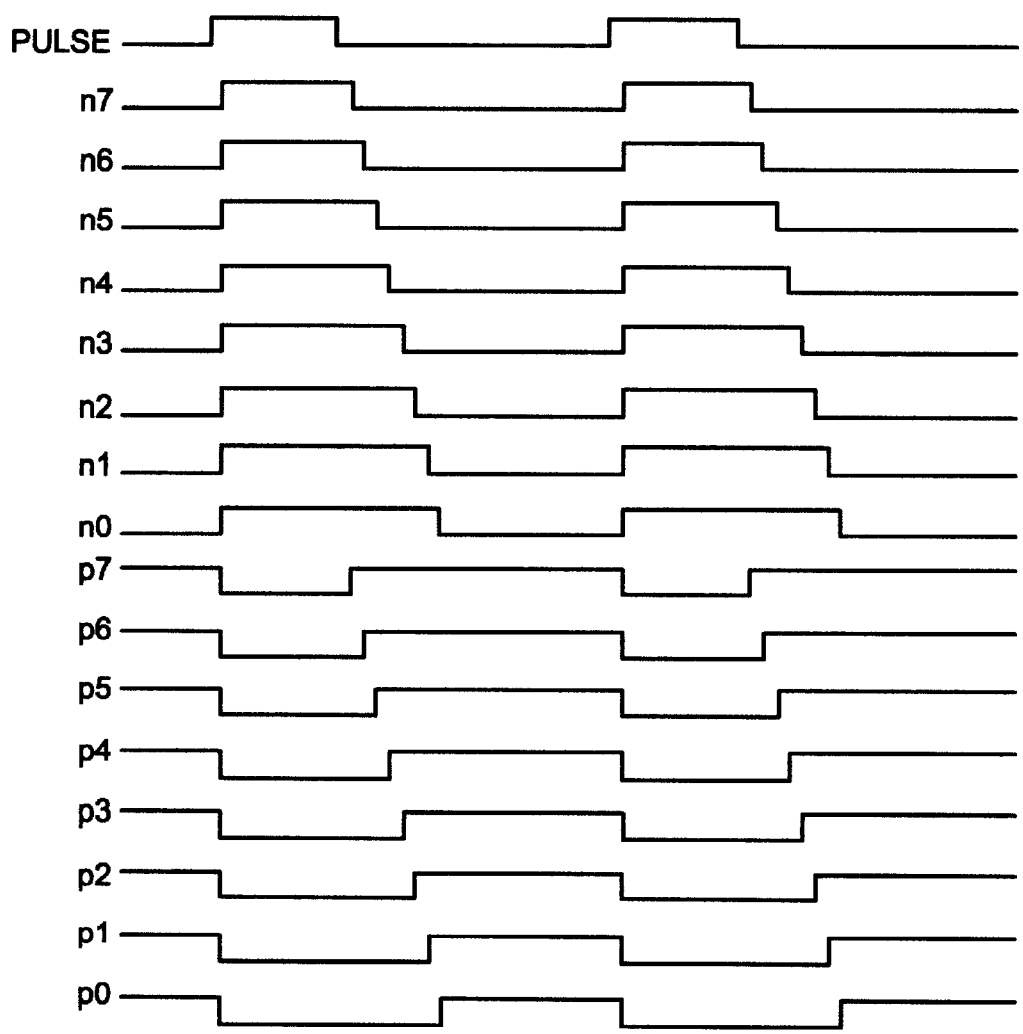
FIG. 4 is a timing chart showing an output of a pulse generation circuit 1 and outputs of an NOR gate and an NAND gate.

FIG. 4 is a chart showing each timing of the output signal PULSE from the pulse generating circuit 1, the outputs n0 to n7 from the NAND gates G10 to G17, and the outputs p0 to p7 from the NOR gates G2 to G9. For example, comparing periods in which the outputs p0 to p7 from the NOR gates G2 to G9 fall to the low level, the low level width of the output p7 from the NOR gate G9 corresponding to the inverter on the last stage in the inverter chain 2 is shortest, and the low level width of the output p0 from the NOR gate G2 corresponding to the inverter on the initial stage is the longest.

On the other hand, the NAND gates G10 to G17 are connected to output terminals of the inverters on the even numbered stages in the inverter chain 4, and each of the NAND gates G10 to G17 executes the NAND operation between an output signal of a corresponding inverter and the output signal PULSE from the pulse generating circuit 1. Outputs from the NAND gates G10 to G17 are supplied to the gate terminal of the corresponding NMOS transistor Q6 in the inverter chain 2.

Comparing periods in which the outputs n0 to n7 from the NAND gates G10 to G17 rise to the high level, the high level width of the output n7 from the NAND gate G17 corresponding to the inverter on the last stage in the inverter chain 2 is shortest, and the high level width of the output n0 from the NAND gate G10 corresponding to the inverter on the initial stage is longest.

As described above, the NOR gates G2 to G9 and the NAND gates G10 to G17 control on/off of the PMOS transistor Q5 and the NMOS transistor Q6 in such a manner that the inverter on the last stage in the inverter chain 2 has the shortest delay time and the inverter on the initial stage in the same has the longest delay time.

Figure 6:
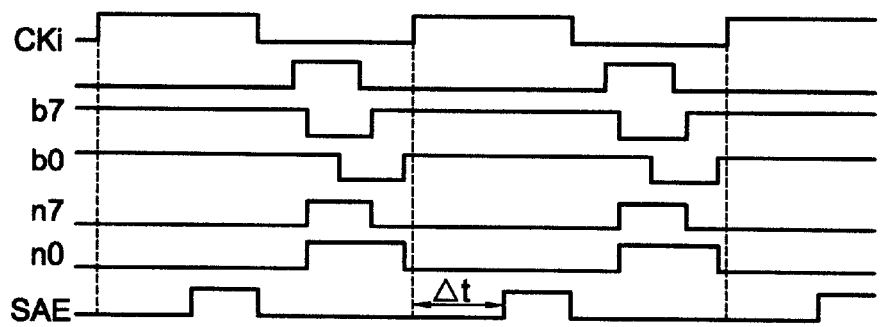
FIG. 6 is a timing chart continued from FIG. 5.
Figure 5A:
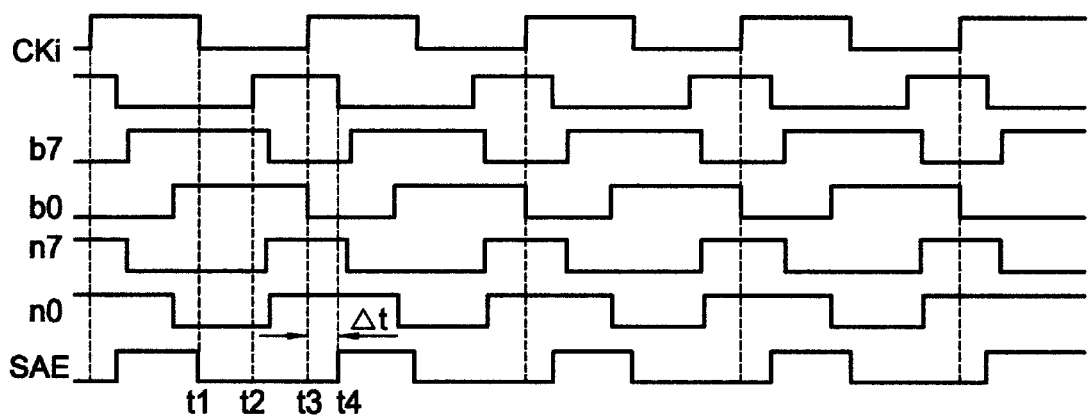
FIGS. 5A to 5C are timing charts showing each part in the circuit illustrated in FIG. 2.
Figure 5B:
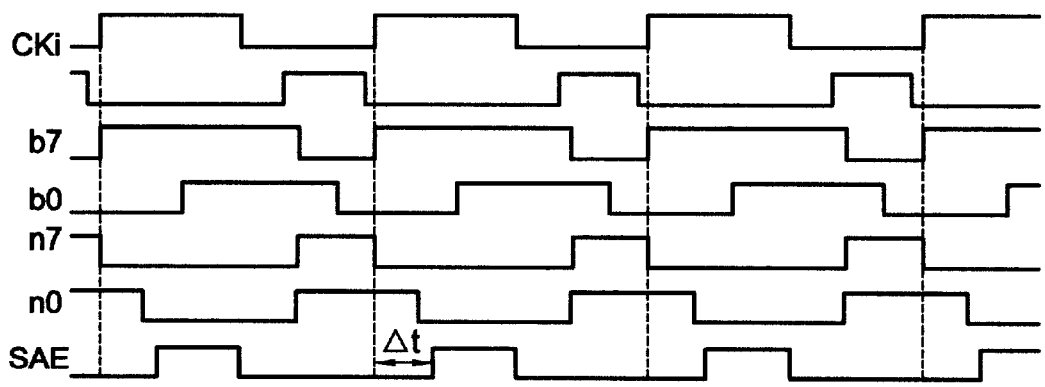
Figure 5C:
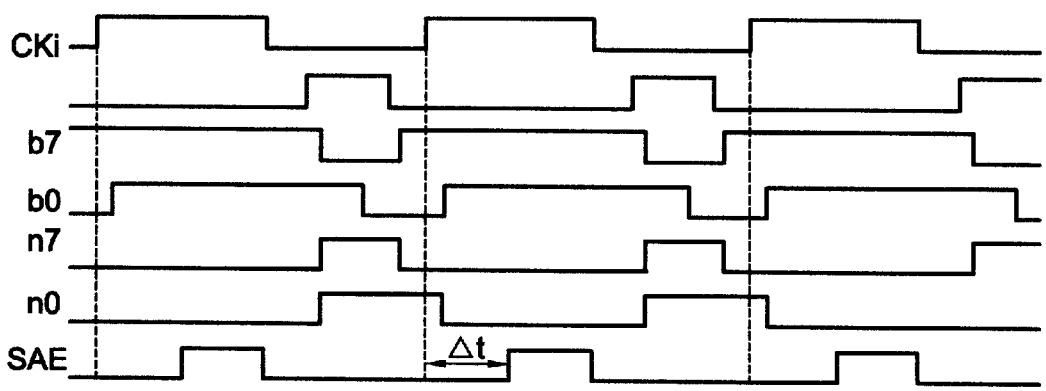

FIGS. 5 and 6 are timing charts of each portion in the circuit illustrated in FIG. 2. FIG. 5A shows the case where a cycle of the input clock signal CKi is 3 ns; FIG. 5B does 4 ns; FIG. 5C does 5 ns; and FIG. 6 does 6 ns. These timing charts illustrate timings for the input clock signal CKi, an input b7 to the inverter chain; an output b0 from the inverter chain, an output n7 from the NAND G17 and an output n0 from the NAND G10. The operation of the circuit illustrated in FIG. 2 will now be described hereinafter with reference to these timing charts.

Description will be first given as to the case where a cycle of the input signal CKi is 3 ns. The pulse generating circuit 1 outputs a pulse signal PULSE by using a trailing edge (time t1 in FIG. 5A) of the input clock signal CKi as a reference (time t2 to t3).

This inverter chain 2 delays this pulse signal PULSE while inverting the logic. FIG. 5A shows signal waveforms of the input b7 to the initial stage in the inverter chain 4 and the output b0 from the last stage in the same. Each of the NAND gates G10 to G17 executes the NAND operation between an output from a corresponding inverter in the inverter chain 4 and the signal b7.

If the outputs from the NAND gates G10 to G17 are on the high level, the delay time of the corresponding inverter in the inverter chain becomes short. Furthermore, if the outputs from the NAND gates G10 to G17 are on the low level, the delay time of the corresponding inverter in the inverter chain 2 becomes long.

In FIG. 5A, since the input clock signal CKi changes from the low level to the high level in a period that the outputs n0 to n7 from the respective inverters in the inverter chain 4 are on the high level, the delay time of each inverter in the inverter chain becomes short.

On the other hand, as shown in FIGS. 5B, 5C and 6, as the cycle of the input clock signal CKi becomes longer, outputs which fall to the low level when the input clock signal CKi rises increase among the outputs n0 to n7 from the NAND gates G10 to G17. Moreover, although not shown in FIGS. 5 and 6, outputs which rise to the high level as the cycle of the input clock signal CKi becomes long increase among the outputs p0 to p7 from the NOR gates G2 to G9.

When the outputs n0 to n7 from the NAND gates G10 to G17 fall to the low level, the delay time of the corresponding inverter in the inverter chain 2 becomes long. Therefore, the delay time in the inverter chain 2 becomes long as outputs which fall to the low level increase among the outputs n0 to n7 and outputs which rise to the high level increase among the outputs p0 to p7. Accordingly, a difference in phase between the input clock signal CKi and the delayed clock signal SAE becomes large as the cycle of the input clock signal CKi becomes long. It is to be noted that a difference in phase between the input clock signal CKi and the delayed clock signal SAE is indicated by Δt.

As described above, in this embodiment, the pulse signal PULSE is generated by using a trailing edge in a given cycle of the input clock signal CKi as a reference, and the delay time in a next cycle of the delayed clock signal SAE is set based on this pulse signal PULSE. Therefore, even if the cycle of the input clock signal CKi varies, the delay time of the delayed clock signal SAE can be rapidly changed in accordance with this variation. Therefore, by utilizing the delayed clock signal of this embodiment as a timing control signal of the latch type sense amplifier, the sense operation timing can be switched in accordance with an operating clock frequency of the sense amplifier, thereby increasing the operation margin of the sense amplifier.

Figure 7:
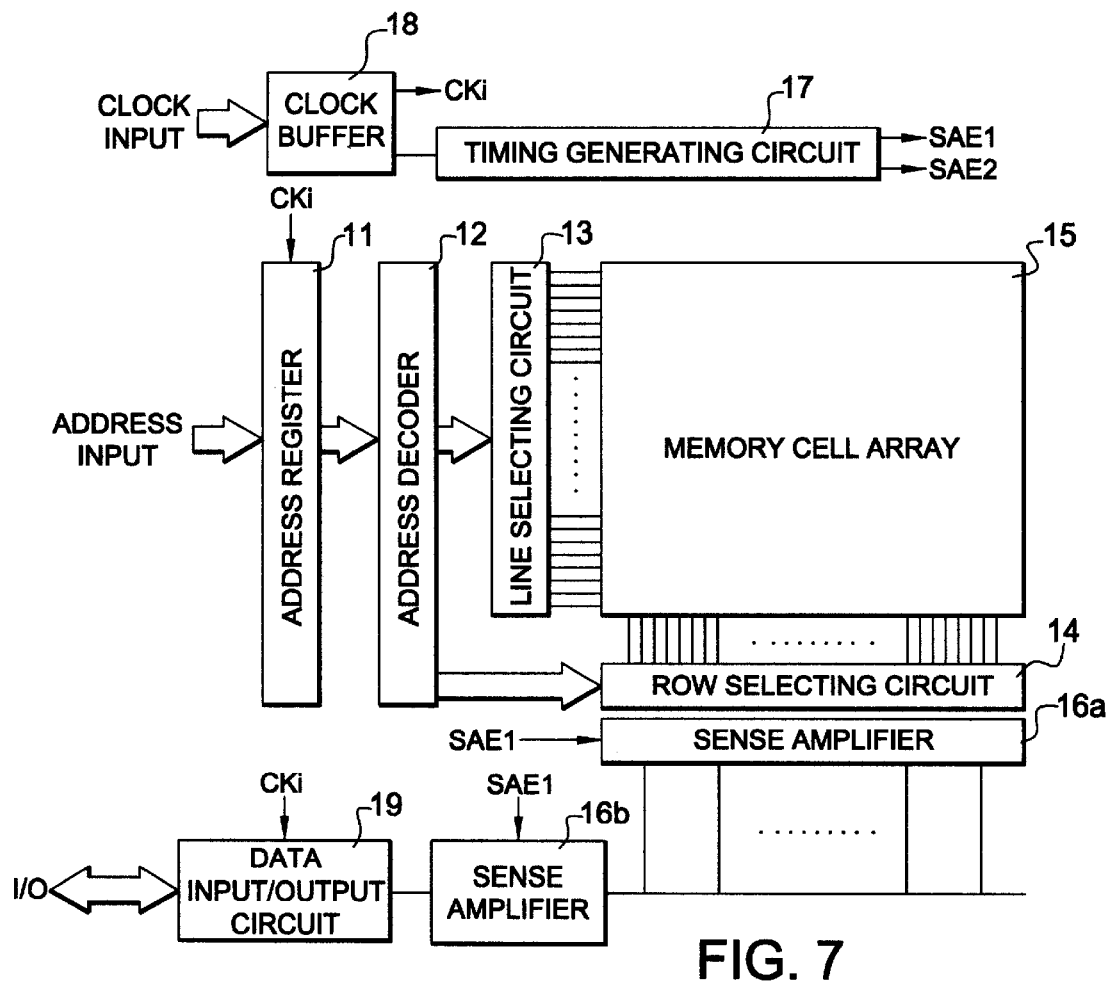
FIG. 7 is a block diagram showing a schematic structure of a data read system of a semiconductor memory.

FIG. 7 is a block diagram showing a schematic configuration of a data read system of a semiconductor memory for performing the timing control of the sense amplifier by using the delayed clock signal SAE generated by the semiconductor integrated circuit according to this embodiment.

An externally inputted read address is inputted to an address decoder 12 through an address register 11 and decoded, and a result of decoding is inputted to a line selecting circuit 13 and a row selecting circuit 14. The line selecting circuit 13 and the row selecting circuit 14 respectively output selection signals, and a specific cell in a memory cell array 15 is read and supplied to a sense amplifier 16a. The sense amplifier 16a performs the sense operation based on delayed clock signals SAE1 and SAE2 supplied from a timing generating circuit 17 having the same structure as that in FIG. 2.

In FIG. 7, two sense amplifiers 16a and 16b are provided. To the respective sense amplifiers 16a and 16b are supplied separate delayed clock signals SAE1 and SAE2 from the timing generating circuit 17. That is, a pair of circuits similar to those in FIG. 2 are provided in the timing generating circuit 17 where the delayed clock signals SAE1 and SAE2 are generated based on an input clock signal CKi inputted through a clock buffer 18. Data sensed (amplified) by the sense amplifier 16 is further amplified by the sense amplifier 16 on the later stage and then outputted to the outside through a data input/output circuit 19.

It is to be noted that the semiconductor integrated circuit shown in FIG. 2 is not used only for switching the sense operation timing of the sense amplifier 16 of, e.g., an SRAM but can be applied to all the circuits using the delayed clock signal SAE.

Further, in the above-described embodiment, description has been given as to the case where the pulse signal PULSE is generated by the pulse generating circuit 1 by using a trailing edge of the input clock signal CKi as a reference and the delay time of the delayed clock signal SAE in a next cycle is adjusted based on the pulse signal PULSE. However, the pulse signal PULSE may be generated by the pulse generating circuit 1 by using a leading edge of the input clock signal CKi as a reference.

Furthermore, the inverter chains (second delaying circuit) 3 and 4 are provided in order to widely assure a frequency range for adjusting the delay time, and they are not essential.

Moreover, when performing a test at a low frequency, such as a D/S test, it is desirable for each inverter in the inverter chain 2 to use an internal timing similar to that in case of a high speed operation. In this case, a test mode switching circuit for constantly setting an output PULSE from the pulse generating circuit 1 in a disabled state (fixed to the high level, in case of FIG. 2) may be provided.

Figure 8:
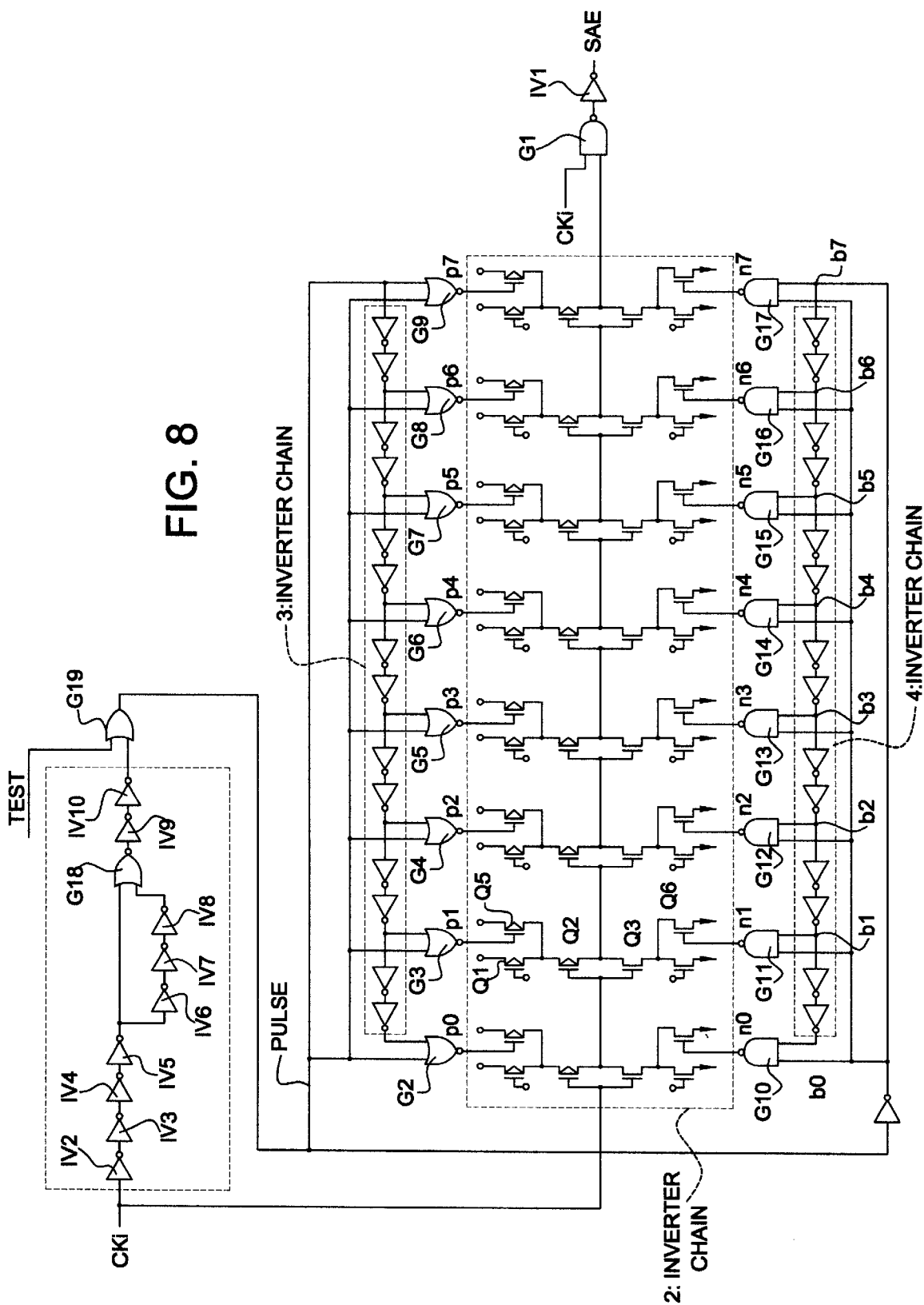
FIG. 8 is a circuit diagram showing a semiconductor integrated circuit having a test mode switching circuit.

FIG. 8 is a circuit diagram of a semiconductor integrated circuit having a test mode switching circuit. The circuit illustrated in FIG. 8 is similarly constituted as the circuit shown in FIG. 2 except that the test mode switching circuit is provided. The test mode switching circuit is configured by an OR gate G19 connected between the pulse generating circuit 1 and the inverter chain. The OR gate G19 calculates a logical sum between a signal TEST which rises to the high level in the test mode and an output from the pulse generating circuit 1. In the test mode, the output from the OR gate G19 is fixed to the high level. Therefore, outputs from the NOR gates G2 to G9 are fixed to the low level, and outputs from the NAND gates G10 to G17 are fixed to the high level, thereby shortening the delay time of each inverter in the inverter chain 2.

Figure 9:
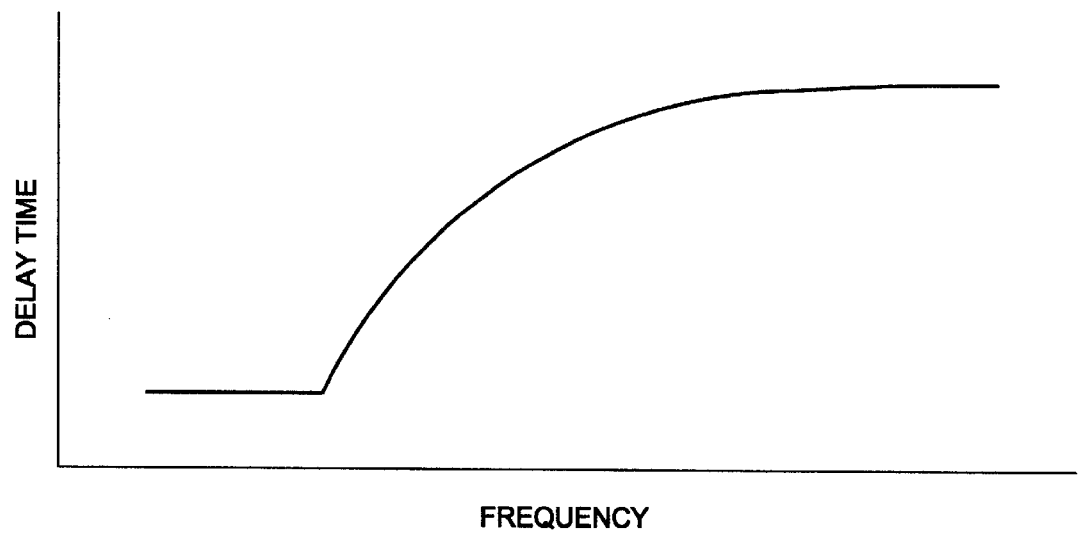
FIG. 9 is a view showing the relationship between a frequency of an input clock signal and a delay time of a delayed clock signal.

Although the above-described embodiment has described an example in which the delay time of each inverter in the inverter chain 2 is substantially linearly changed in accordance with a frequency of the input clock signal CKi, the delay time of each inverter in the inverter chain 2 may be non-linearly changed in accordance with a frequency of the input clock signal CKi. For example, FIG. 9 shows an example where the delay time of the delayed clock signal SAE is non-linearly changed in accordance with a frequency of the input clock signal CKi. As described above, by non-linearly changing the delay time of the delayed clock signal SAE in accordance with a frequency of the input clock signal CKi, the delayed clock signal SAE optimum for a frequency of the input clock signal CKi can be generated.

What is claimed is:

1. A semiconductor integrated circuit for generating a delayed clock signal synchronized with an input clock signal based on said input clock signal, comprising:

an edge pulse generating circuit configured to generate a control pulse signal at a first cycle of said input clock signal based only on a leading edge and a trailing edge of the first cycle of said input clock signal; and a delay time setting circuit configured to set a delay time of said delayed clock signal of a second cycle of said input clock signal after the first cycle based on said control pulse signal.

2. The semiconductor integrated circuit according to claim 1, wherein said delay time setting circuit includes:

a plurality of first delaying circuits cascade-connected to each other; and a plurality of delay controlling circuits each of which is provided in accordance with each of said plurality of first delaying circuits and varies a delay time of a corresponding first delaying circuit based on said control pulse signal, each of said first delaying circuits sequentially propagating said input clock signal.

3. The semiconductor integrated circuit according to claim 2, wherein each of said first delaying circuits has an inverter circuit capable of varying electric current drivability based on said control pulse signal.

4. The semiconductor integrated circuit according to claim 2, wherein said delay controlling circuit can set delay times which are different from each other for each of said first delaying circuits.

5. The semiconductor integrated circuit according to claim 4, where in said delay controlling circuit includes:

a plurality of second delaying circuits cascade-connected to each other, said control pulse signal being inputted to said second delaying circuits at a first stage; and an electric current drivability setting circuit configured to set a delay time of each of said first delaying circuits based on an output from each of said second delaying circuits and said control pulse signal.

6. The semiconductor integrated circuit according to claim 5, wherein said electric current drivability setting circuit makes a delay time of said first delaying circuit on a later stage longer than a delay time of said first delaying circuit on an earlier stage among said plurality of first delaying circuits.

7. The semiconductor integrated circuit according to claim 6, wherein each of said second delaying circuits has an inverter circuit for propagating said control pulse signal while inverting the same.

8. The semiconductor integrated circuit according to claim 7, wherein said electric current drivability setting circuit includes a plurality of logic operation circuits provided in accordance with said plurality of first delaying circuits, each of said logic operation circuits setting a delay time of said corresponding first delaying circuit based on an output from a corresponding inverter circuit and said control pulse signal.

9. The semiconductor integrated circuit according to claim 2, wherein each of said plurality of first delaying circuits includes:

a first PMOS transistor, a second PMOS transistor, a first NMOS transistor, and a second NMOS transistor connected in series between first and second voltage terminals;

a third PMOS transistor which is connected in parallel with said first PMOS transistor and controlled to be turned on/off by said delay controlling circuit; and a third NMOS transistor which is connected in parallel with said second NMOS transistor and controlled to be turned on/off by said delay controlling circuit, said first PMOS transistor and said second NMOS transistor being always set at the ON state.

10. The semiconductor integrated circuit according to claim 9, wherein said delay controlling circuit includes:

a plurality of second delaying circuits which propagate said control pulse signal while delaying said control pulse signal and are cascade-connected to each other;

a plurality of third delaying circuits which propagate said control pulse signal while delaying said control pulse signal and are cascade-connected to each other;

a plurality of first logic operation circuits, each configured to control on/off of a corresponding said third PMOS transistor based on an output from a corresponding second delaying circuit and said control pulse signal; and a plurality of second logic operation circuits configured to control on/off of a corresponding said third NMOS transistor based on an output from a corresponding third delaying circuit and said control pulse signal.

11. The semiconductor integrated circuit according to claim 2, further comprising a switching circuit configured to switch whether a delay time of each of said first delaying circuits is one of fixed and variable.

12. The semiconductor integrated circuit according to claim 5, further comprising:

a delay clock generating circuit configured to generate said delayed clock signal based on an output from each of said plurality of first delaying circuits on a last stage and said input clock signal; and a sense operation controlling circuit configured to switch whether a signal used for amplifying a difference in potential between a pair of bit lines is outputted based on said delayed clock signal.

13. A delayed clock signal generation method for generating a delayed clock signal in synchronization with an input clock signal based on said input clock signal comprising:

generating a control pulse signal in accordance with a first cycle of said input clock signal based only on a leading edge and a trailing edge of the first cycle of said input clock signal; and setting a delay time of said delayed clock signal in a second cycle of said input clock signal after the first cycle based on said control pulse signal.

14. A semiconductor integrated circuit configured to generate a delay clock signal that is synchronized with an input clock signal based on said input clock signal, comprising:

a control pulse generating circuit configured to generate a control pulse signal of said input clock based on one of a leading edge and a trailing edge of said input clock signal; and a delay time setting circuit configured to set a delay time of said delay clock signal based on said control pulse signal, said delay time setting circuit comprising:

first to nth delaying circuits connected in series, each of said first to nth delaying circuits propagating said input clock signal in order; and (n+1)th to 2nth delaying circuit connected in series, each of said (n+1)th to 2nth circuits propagating said control pulse signal, and said (n+1)th to 2nth delaying circuits corresponding to said first to nth delaying circuits, respectively, wherein the delay time in each of said first to nth delaying circuits is set based on said control pulse signal and output of the corresponding one of said 2nth to (n+1)th delaying circuits.

15. The semiconductor integrated circuit according to claim 14, wherein said delay time setting circuit further has a (2n+1)st delaying circuit connected to a subsequent stage of said nth delaying circuit, the delay time of said (2 n+1)st delaying circuit being set based on said control pulse signal.

16. The semiconductor integrated circuit according to claim 14, wherein each of said first to nth delaying circuits has an inverter circuit capable of varying electric current drivability.

17. The semiconductor integrated circuit according to claim 14, wherein said delay time setting circuit includes first to nth logic operation circuits corresponding to said first to nth delaying circuits, respectively, and wherein each of said first to nth logic operation circuits controls electric current drivability of said first to nth delaying circuits based on said control pulse signal and an output of the corresponding one of said 2nth to (n+1)st delaying circuits.

18. The semiconductor integrated circuit according to claim 16, wherein each of said first to nth logic operation circuits increases electric current drivability of the corresponding one of said first to nth delaying circuits, when either of said control pulse signal or an output of the corresponding one of said 2nth to (n+1)th delaying circuits is a prescribed logic level.

19. The semiconductor integrated circuit according to claim 16, further comprising a switching circuit configured to switch whether a delay time of each of said first to nth delaying circuits is one of fixed and variable.

20. The semiconductor integrated circuit according to claim 16, further comprising:

a delay clock generating circuit configured to generate said delay clock signal based on an output of said (2n+1)st delaying circuit and said input clock signal; and a sense operation control circuit configured to switch whether a signal used for amplifying a difference in potential between a pair of bit lines is outputted based on said delay clock signal.

* * * * *

UNITED STATES PATENT AND TRADEMARK OFFICE
CERTIFICATE OF CORRECTION

PATENT NO.    : 6,469,557 B2
DATED         : October 22, 2002
INVENTOR(S)   : Osamu Hirabayashi It is certified that error appears in the above-identified patent and that said Letters Patent is hereby corrected as shown below:

<u>Column 10,</u>
Line 25, "(n+1)th" has been replaced with -- (n+1)st --.

Signed and Sealed this

Twenty-fifth Day of March, 2003

JAMES E. ROGAN
*Director of the United States Patent and Trademark Office*